United States Patent [19]
Tsoi et al.

[11] Patent Number: 5,631,484
[45] Date of Patent: May 20, 1997

[54] METHOD OF MANUFACTURING A SEMICONDUCTOR DEVICE AND TERMINATION STRUCTURE

[75] Inventors: Hak-Yam Tsoi, Scottsdale; Pak Tam; Edouard D. de Frésart, both of Tempe, all of Ariz.

[73] Assignee: Motorola, Inc., Schaumburg, Ill.

[21] Appl. No.: 576,983

[22] Filed: Dec. 26, 1995

[51] Int. Cl.⁶ .......................... H01L 29/76; H01L 21/265
[52] U.S. Cl. .......................... 257/341; 257/327; 257/390; 257/401; 257/620; 257/635; 257/756; 257/773; 438/273; 438/140
[58] Field of Search .......................... 257/327, 341, 257/401, 620, 635, 756, 773; 437/29, 148, 149, 150, 154, 913

[56] References Cited

U.S. PATENT DOCUMENTS

| | | |
|---|---|---|
| 4,375,717 | 3/1983 | Tonnel . |
| 4,503,598 | 3/1985 | Vora et al. . |
| 4,748,103 | 5/1988 | Hollinger . |
| 4,798,810 | 1/1989 | Blanchard et al. . |
| 4,879,254 | 11/1989 | Tsuzuki et al. . |
| 4,898,835 | 2/1990 | Cawlfield . |
| 4,960,723 | 10/1990 | Davies ........................ 437/41 |
| 5,171,705 | 12/1992 | Choy . |
| 5,182,222 | 1/1993 | Malhi et al. . |
| 5,304,831 | 4/1994 | Yilmaz et al. ................ 257/341 |

OTHER PUBLICATIONS

Christa Hardie, Electronic News—vol. 41—No. 2094, "TR Unveils 4–Step Masking Technology", Dec. 4, 1994, p. 74.

*Primary Examiner*—Edward Wojciechowicz
*Attorney, Agent, or Firm*—Kevin B. Jackson

[57] ABSTRACT

A method for forming a semiconductor device includes forming insulated gate regions (122,222) on a substrate (26) using a first photo-masking step, forming a base region (47) through an opening (143) between the insulated gate regions (122,222), and forming a source region (152) within the base region (47). Next, a protective layer (61) is formed and selectively patterned using a second photo-masking step to form an opening (62) within the first opening (143) and an opening (63) above one of the insulated gate regions (122). Next, a portion (66) of the substrate (26) and a portion (67) of the insulated gate region (122) are removed. Ohmic contacts (74,76) are then formed and patterned using a third photo-masking step. Additionally, a termination structure (81) is described.

20 Claims, 14 Drawing Sheets

METHOD OF MANUFACTURING A SEMICONDUCTOR DEVICE AND TERMINATION STRUCTURE

BACKGROUND OF THE INVENTION

This invention relates, in general, to semiconductor wafer processing, and more particularly to methods for forming power metal oxide semiconductor field effect transistor (MOSFET) devices.

Power MOSFET devices are well known and are used in many applications including automotive electronics, portable electronics, power supplies, and telecommunications. With an ever-increasing push towards cost competitive products, semiconductor manufacturers are seeking ways to reduce the costs of manufacturing semiconductor components, such as power MOSFET devices. Photolithographic processes add significant cost to the manufacture of semiconductor components. This is due in part to the cost of the equipment, the amount of labor required to process the components, and the number of steps required to provide a photolithographic pattern.

In a conventional power MOSFET process, up to eight photo-masking steps are required to produce a device. These eight steps include an active-area masking step where a thick field oxide region is left around the periphery of the device, a gate layer masking step, a base masking step, a first blocking mask for forming the source regions, a second blocking mask for forming base contact regions, a contact mask, a metal mask, and a final passivation mask. Some manufacturers have reduced the number of masking steps to four or five by incorporating self-aligned base and source regions and by eliminating the final passivation.

Although some progress has been made in reducing the number of photo-masking steps required to manufacture a power MOSFET device, methods and structures are still desirable that further reduce the number of photo-masking steps required. These methods and structures should maintain or improve device quality and performance compared to existing processes.

DETAILED DESCRIPTION OF THE DRAWINGS

In general, the present invention relates to a method for manufacturing a power MOSFET device that requires only three photo-masking steps. In particular, the method only requires a gate layer photo-masking step, a contact photo-masking step, and an ohmic or metal photo-masking step. The method according to the present invention is achieved by, among other things, eliminating a field-oxide/active area photo-masking step and by forming a base contact and a gate layer contact in a single masking step. Additionally, according to the present invention, an edge termination structure is provided that, among other things, supports the elimination of the field oxide.

Figure 1:
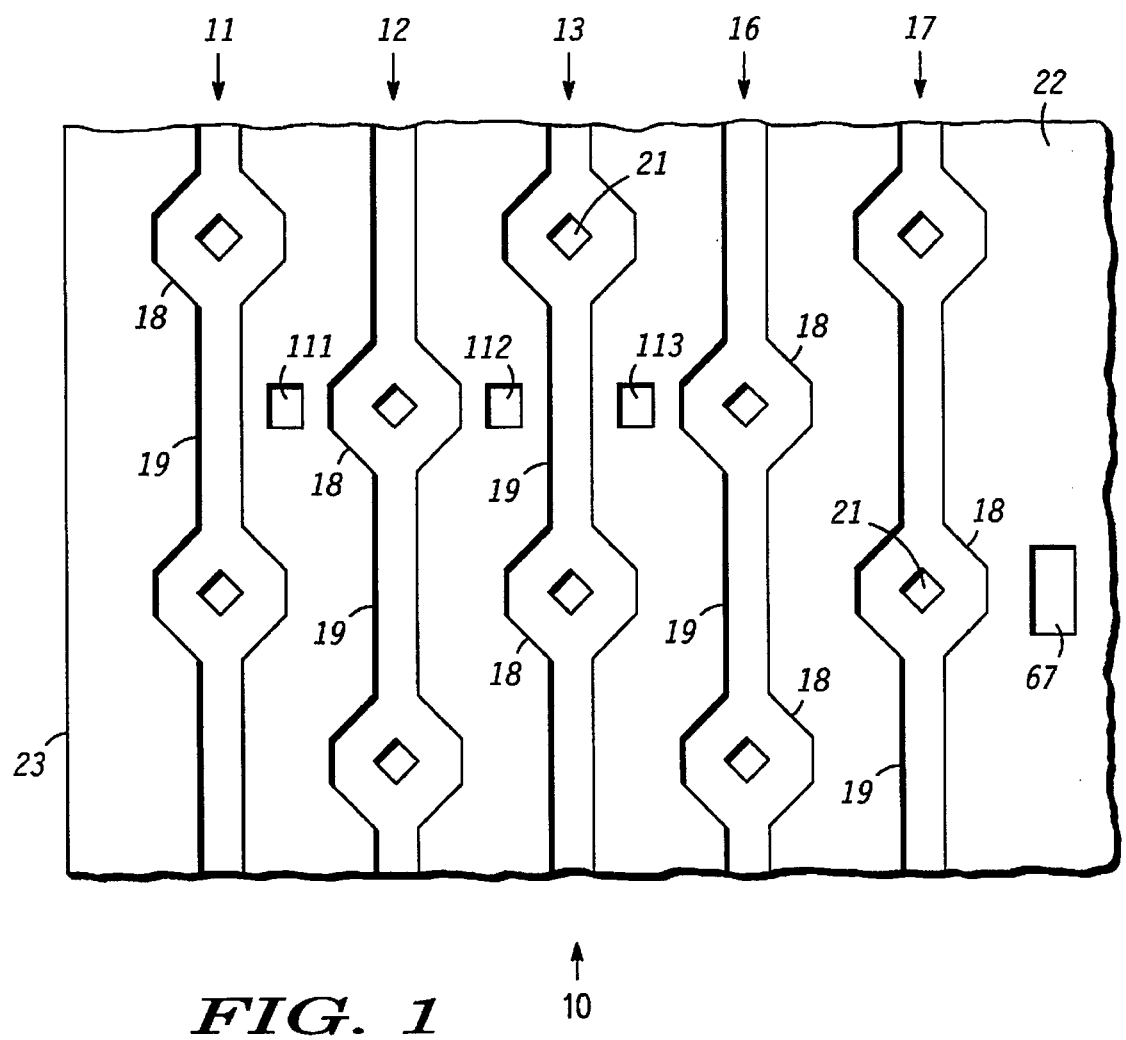
FIG. 1 illustrates an enlarged top view of a portion of a power MOSFET device suitable for manufacture using the present invention.

The present invention is better understood by referring to FIGS. 1–14 together with the following detailed description. FIG. 1 shows an enlarged top view of a preferred embodiment of a portion of a power MOSFET structure that will be used to illustrate the present invention. Vertical power MOSFET device, semiconductor device, or structure 10 includes stripes 11, 12, 13, 16, and 17. Stripes 11–13 form a termination region or portion of structure 10 and stripes 16 and 17 are part of an active region or portion of structure 10. As will be described in more detail below, stripes 11–13 and 16–17 form base and source regions for structure 10.

Figure 13:
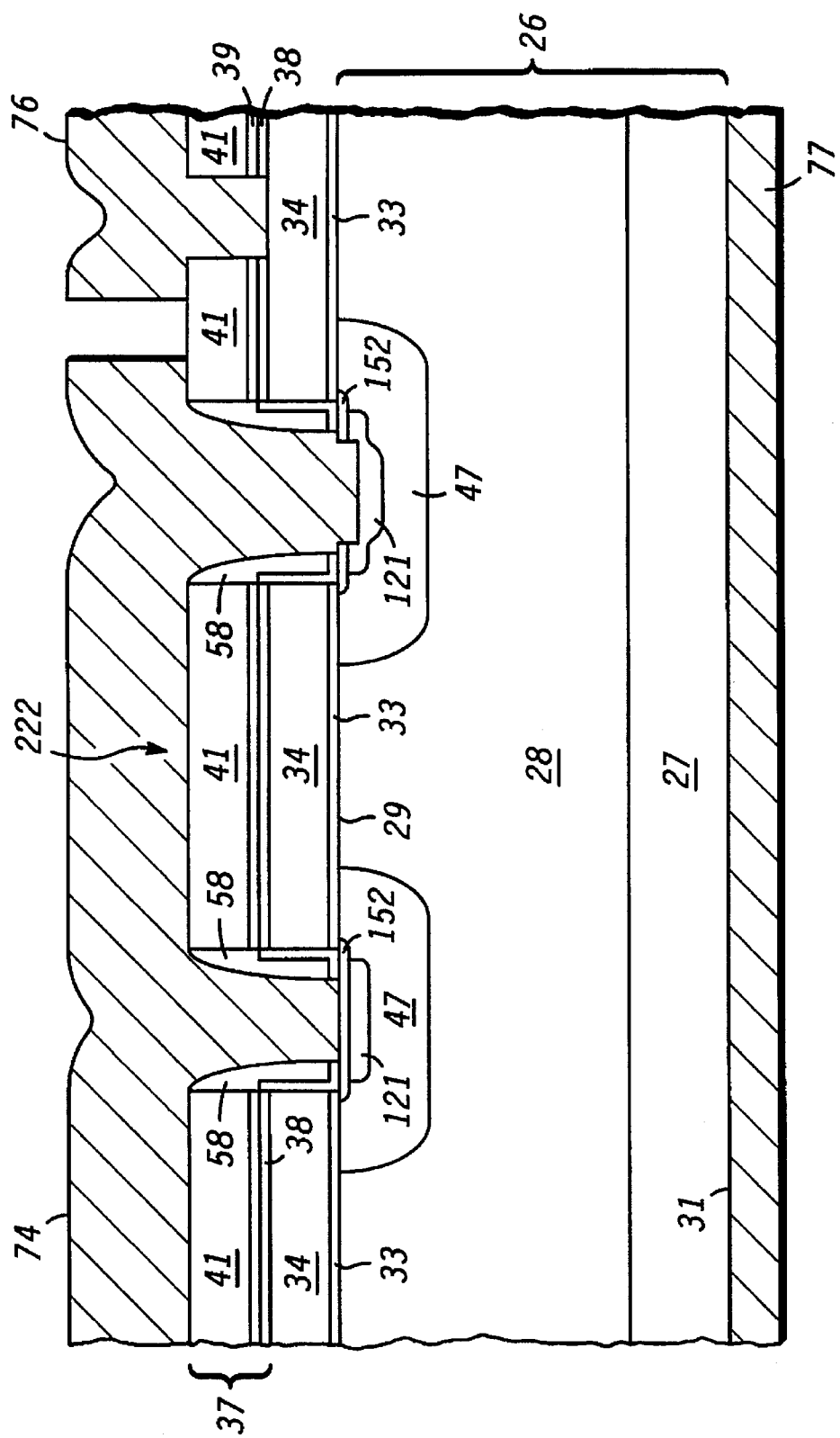
Figure 14:
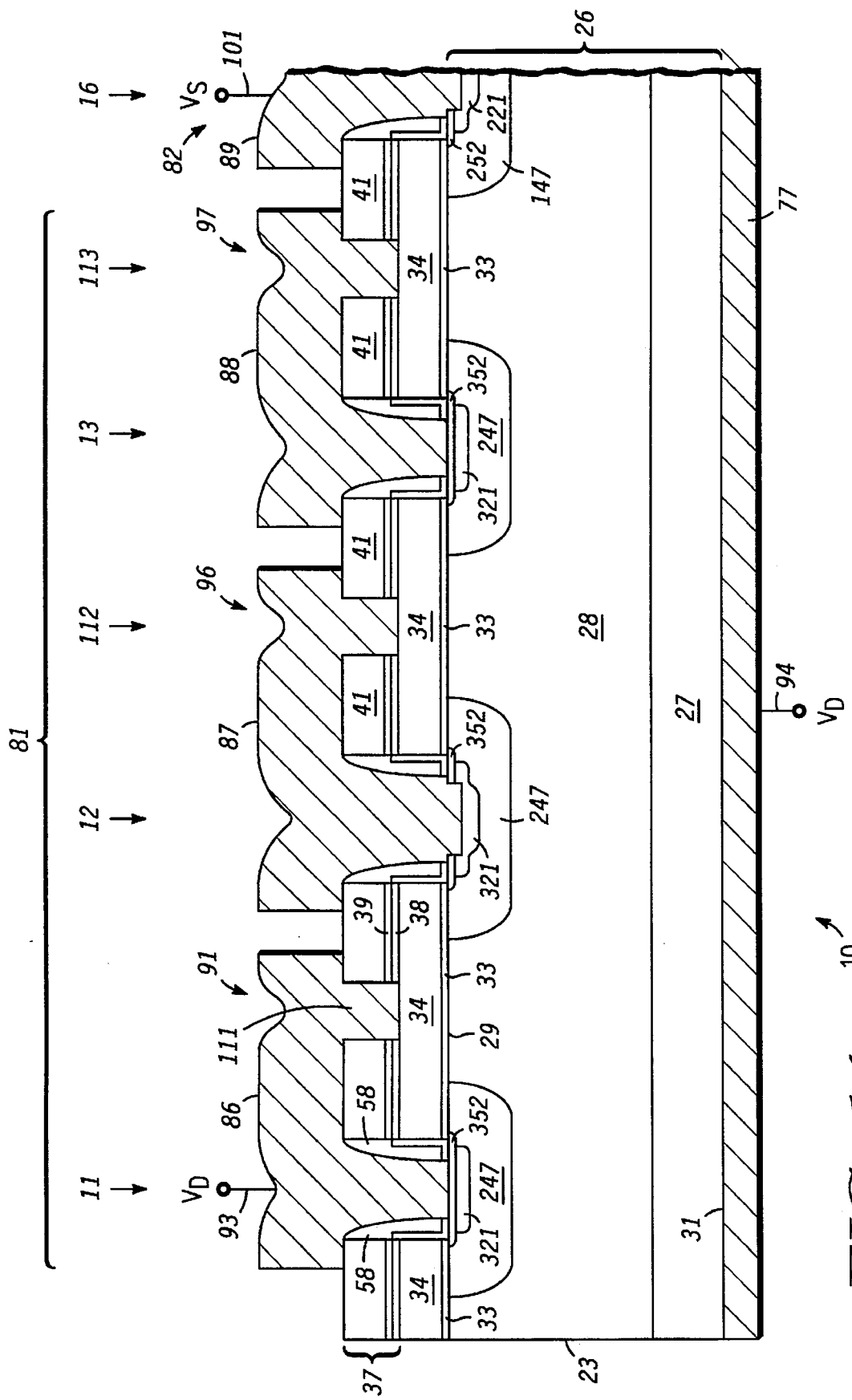
FIG. 14 illustrates an enlarged cross-sectional view of an embodiment of an edge termination structure according to the present invention.

Gate contact portions or regions 111, 112, and 113 are formed adjacent to stripes 11, 12, and 13 respectively and are more fully described in conjunction with FIG. 14. A gate contact portion or region 67 is shown adjacent to stripe 17 and is more fully described in conjunction with FIGS. 2–13. It is understood that gate contact portions 67, 111, 112, and 113 may be shaped differently and placed elsewhere on structure 10 according to design lay-out requirements and are shown where they are in FIG. 1 to best describe the present invention.

Each stripe includes a dumb-bell portion or region 18 and a narrowed or stripe portion 19. Each dumb-bell portion includes a base contact region 21. Each stripe is separated by an insulated gate portion 22. Structure 10 further includes an edge or outer portion 23. Further details of this dumb-bell design are provided in co-pending U.S. patent application Ser. No. 08/393,772 entitled "Vertical IGFET Configuration Having Low On-Resistance and Method", by Lynnita K. Knoch et al., and assigned to Motorola Inc.

Figure 2:
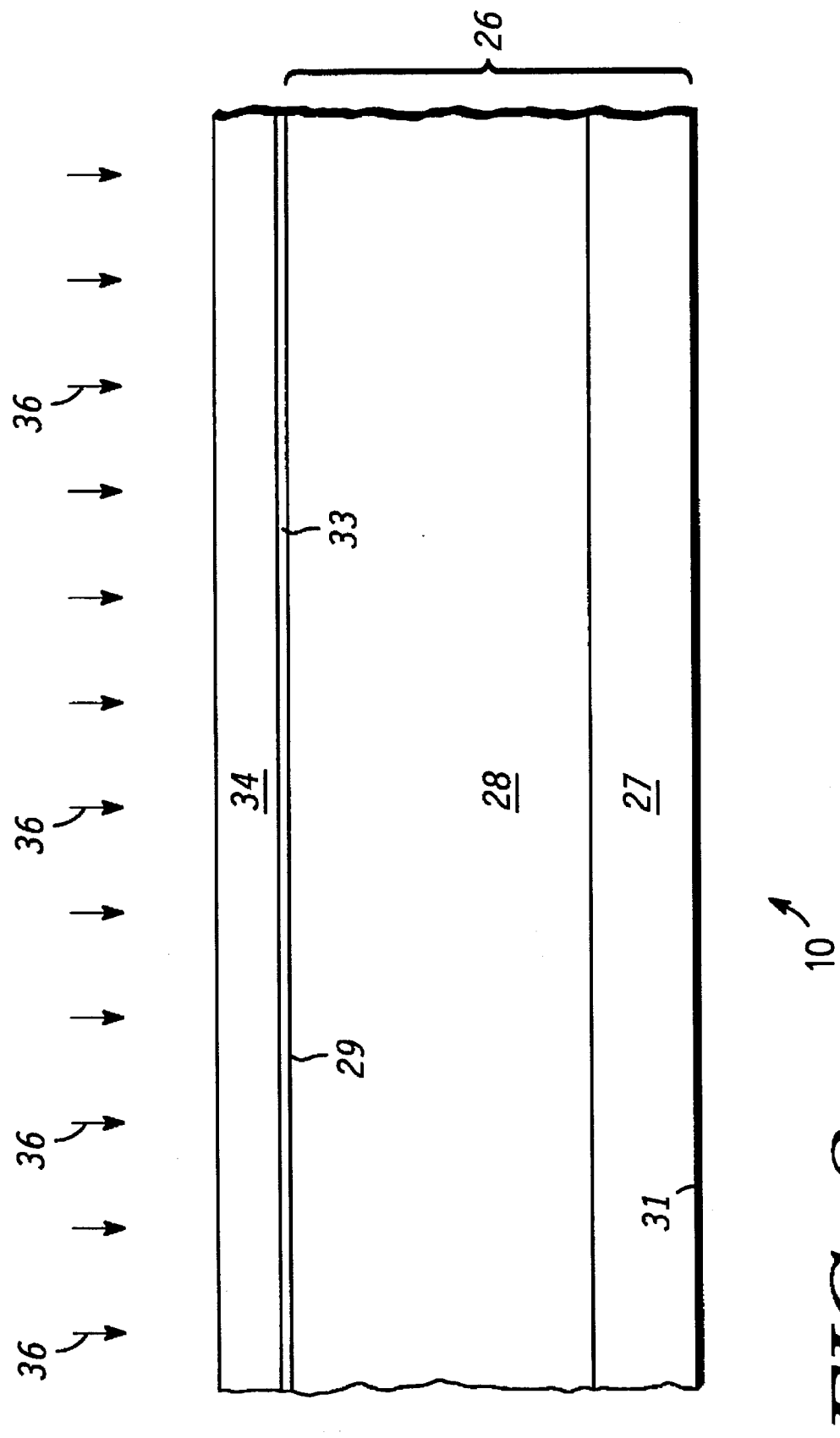
FIGS. 2–13 illustrate enlarged cross-sectional views of a portion of the device of FIG. 1 at various stages of manufacture.

Turning now to FIGS. 2–13, a method for forming structure 10 is now described. The enlarged cross-sections of FIGS. 2–13 are cross-sections of stripes 16 and 17 of FIG. 1, including a stripe portion 19 and a dumb-bell portion 18. FIG. 2 illustrates a highly enlarged cross-sectional view of a portion of structure 10 at an early stage of manufacture. For the following example, an n-channel device is illustrated. However, as those skilled in the art will appreciate, the present invention applies also to a p-channel device.

Structure 10 includes a semiconductor substrate or substrate 26, which preferably comprises a starting substrate 27 and a semiconductor layer 28 formed over starting substrate 27. According to the present invention, substrate 26 is provided without a field oxide (i.e., an oxide typically having a thickness greater than about 5,000 angstroms), which eliminates the need for an active area photo-masking mask.

Starting substrate 27 preferably comprises silicon and has, for example, a doping concentration of about $1.0 \times 10^{19}$ to $1.0 \times 10^{20}$ atoms/cm$^3$. For an n-channel device, starting substrate 27 preferably is doped with arsenic. Semiconductor layer 28 is formed, for example, using conventional epitaxial growth techniques. For an n-channel device, semiconductor layer 28 preferably is doped with phosphorous. The thickness of semiconductor layer 28 and its dopant concentration depend on the application (e.g., the desired breakdown voltage of the device). For example, for a 20 volt n-channel device, semiconductor layer 28 has thickness of about 2.0 microns to about 3.0 microns and an n-type dopant concentration of about $4.0 \times 10^{16}$ to about $8.0 \times 10^{17}$ atoms/cm$^3$. Substrate 26 further includes a major surface 29 and a major surface 31 opposite major surface 29.

FIG. 2 further illustrates a gate dielectric layer 33 formed over major surface 29 and a polycrystalline gate layer or conductive layer 34 formed over gate dielectric layer 33. Gate dielectric layer 33 comprises, for example, a gate oxide layer having a thickness in a range from about 150 angstroms to about 1,000 angstroms. The thickness of gate dielectric layer 33 depends on the application. For example, for a 20 volt device, gate dielectric layer 33 preferably is about 250 angstroms thick. For a 30 volt device, gate dielectric layer 33 preferably is about 400 angstroms thick. For a 60 volt device, gate dielectric layer 33 preferably is about 800 angstroms thick.

According to the present invention, gate dielectric layer 33 is formed to edge 23 (shown in FIG. 1) of structure 10 and, as will be described in more detail below, becomes part of the termination portion of structure 10. Polycrystalline gate layer 34 preferably comprises a doped polysilicon layer and is formed using conventional deposition techniques. Preferably, polycrystalline gate layer 34 is formed undoped and is subsequently doped using ion implantation, as represented by arrows 36. Preferably, polycrystalline gate layer 34 has a thickness of about 2,500 angstroms to about 4,000 angstroms and is doped with arsenic. An implant dose of about $1.0 \times 10^{16}$ atoms/cm$^2$ and an implant energy of about 40 to 70 kilo electron volts (keV) is suitable.

Figure 3:
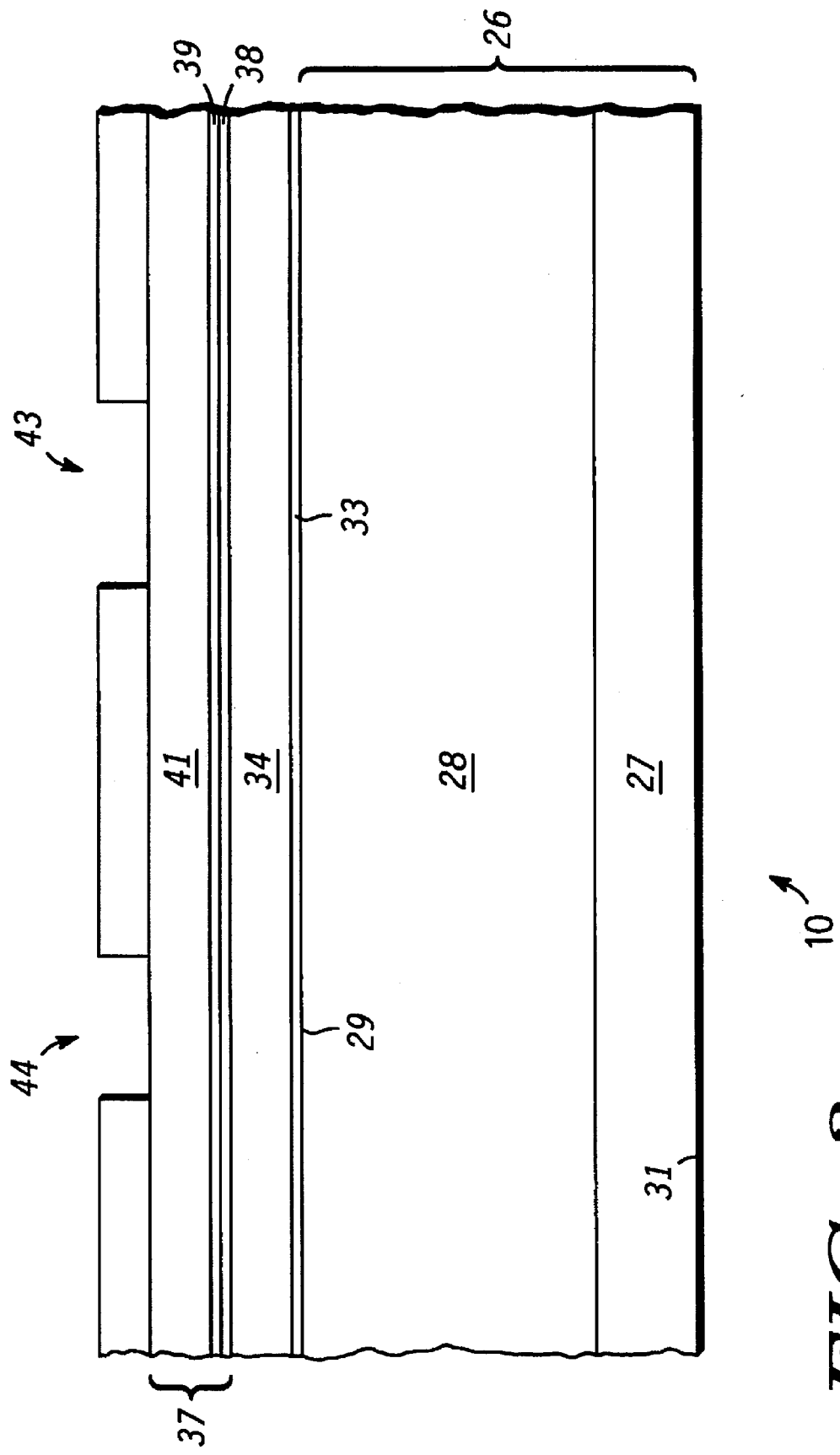

FIG. 3 illustrates structure 10 at a subsequent step of fabrication. In particular, FIG. 3 shows substrate 26 after a dielectric layer or interlayer dielectric 37 is formed over polycrystalline gate layer 34. In a preferred embodiment, dielectric layer 37 comprises an oxide layer 38 formed over polycrystalline gate layer 34, a nitride layer 39 formed over oxide layer 38, and an oxide layer 41 formed over nitride layer 39. Preferably, oxide layer 38 comprises a silicon oxide having a thickness of about 350 angstroms to about 600 angstroms, nitride layer 39 comprises a silicon nitride having thickness of about 300 angstroms to about 700 angstroms, and oxide layer 41 comprises a doped (e.g., phosphorous, boron, or a combination thereof) silicon oxide having a thickness of about 5,000 angstroms to about 7,000 angstroms. The outer portion (e.g., oxide layer 41) of dielectric layer 37 preferably is doped to allow for the elimination of a final passivation layer.

Figure 4:
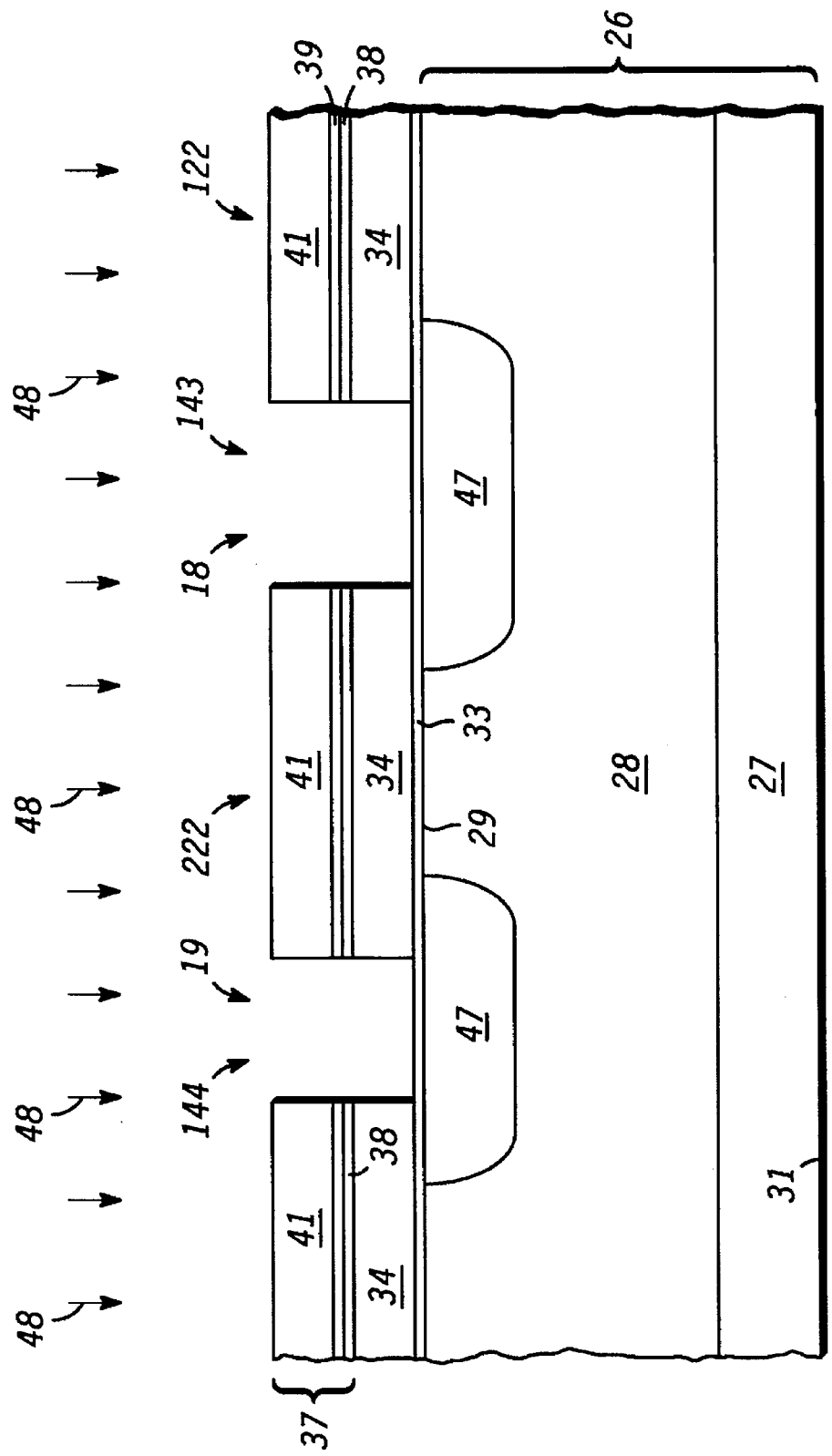

FIG. 3 further shows a protective layer 42 formed over dielectric layer 37. Protective layer 42 is shown patterned with openings 43 and 44 and comprises, for example, a patterned photoresist layer. According to the present invention, patterned protective layer 42 represents a first photo-masking step. Following the formation of protective layer 42, exposed portions of dielectric layer 37 and polycrystalline gate layer 34 are etched through openings 43 and 44 to provide formed openings 143 and 144 as shown in FIG. 4. After the above step, insulated gate portions or regions 122 and 222 are formed on major surface 29. Insulated gate regions 122 and 222 are separated by dumbbell portion 18 and insulated gate region 222 and a stripe portion 19 is adjacent insulated gate region 222.

Preferably, gate dielectric layer 33 is left in formed openings 143 and 144 to provide a screen oxide for a subsequent doping step. Optionally, portions of gate dielectric layer 33 are removed together with dielectric layer 37 and polycrystalline gate layer 34 and a new screen oxide is formed over exposed portions of major surface 29. Next, doped regions or base regions 47 are formed extending from major surface 29 into substrate 26 and are self-aligned to insulated gate portions 122 and 222.

Preferably, doped regions 47 are formed using ion implantation (as represented by arrows 48). Doped regions 47 are doped with a dopant having an opposite conductivity type from substrate 26. For example, in an n-channel device, doped regions 47 preferably are formed using boron ion implantation with a dose of about $2.0 \times 10^{13}$ atoms/cm$^2$ to about $5.0 \times 10^{13}$ atoms/cm$^2$ being suitable. The energy of the implant is adjusted according to the thickness of gate dielectric layer 33. For example, when gate dielectric layer 33 is about 250 angstroms thick, an implant energy of about 25 keV to 50 keV is suitable.

Figure 5:
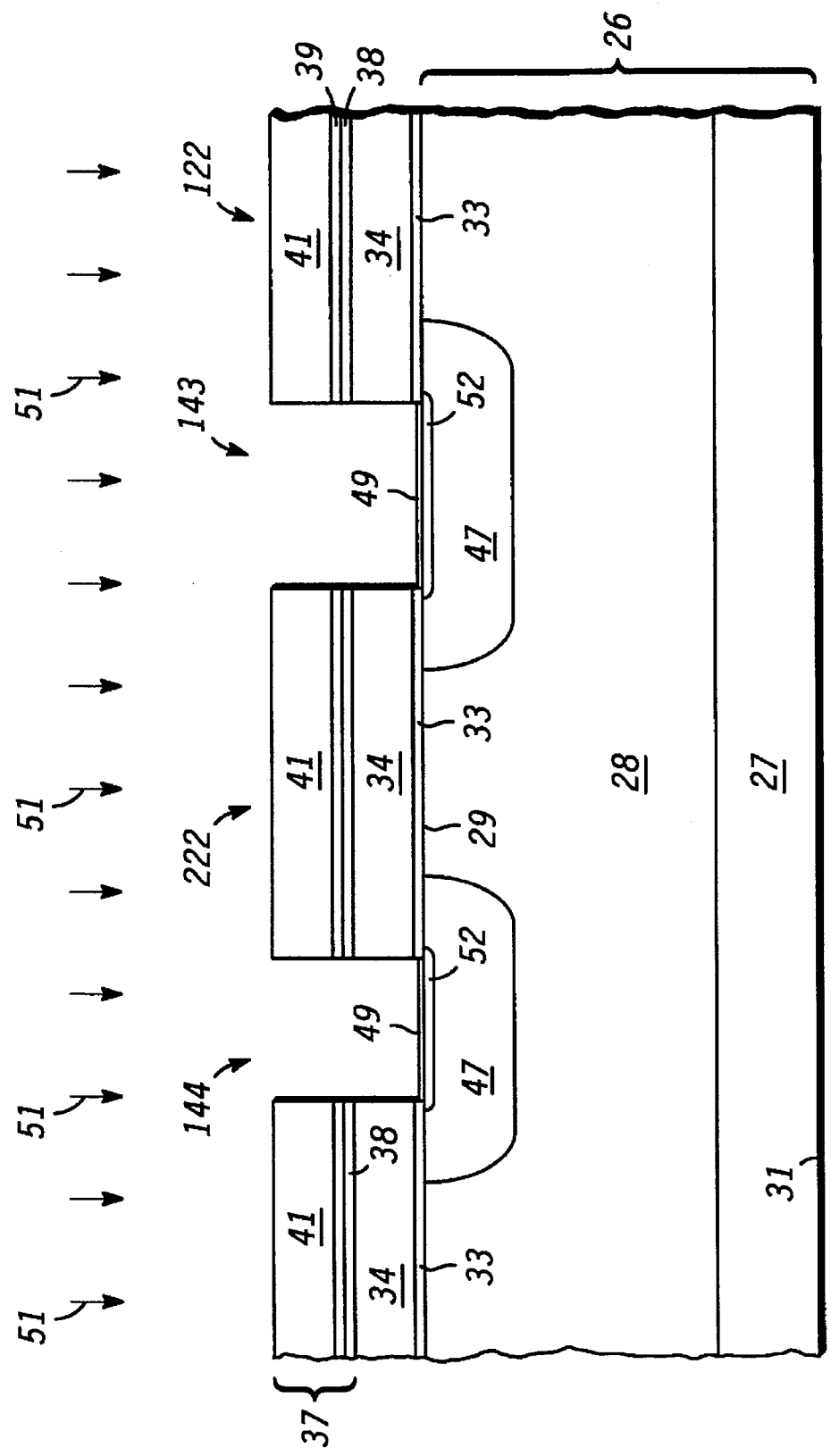

After implantation, the implanted dopant is diffused and activated using an appropriate anneal cycle. For example, the implanted dopant is exposed to a temperature of about 1000° C. to about 1100° C. for about 60 to about 90 minutes to provide the structure shown in FIG. 4. Alternatively, an comparable rapid thermal anneal is used. Following the anneal, the exposed portions of gate dielectric layer 33 are removed using conventional etching techniques. Next, a screen oxide layer 49 is formed over the exposed portions of major surface 29 using conventional oxidation techniques as shown in FIG. 5. Preferably, screen oxide layer 49 has a thickness of about 100 angstroms to about 400 angstroms. Optionally, gate dielectric layer 33 is left unetched and used as a screen oxide instead of screen oxide layer 49 in a subsequent doping step.

Next, dopant is incorporated into substrate 26 through formed openings 143 and 144. Preferably, for an n-channel device, an n-type dopant is ion implanted (as represented by arrows 51) into substrate 26 within doped regions 47 to form or provide implanted regions 52. Implanted region 52 are self-aligned to insulated gate regions 122 and 222. Preferably, an arsenic implant is used with an implant dose of about $4.0 \times 10^{15}$ atoms/cm$^2$ to about $8.0 \times 10^{15}$ atoms/cm$^2$ and implant energy of about 60 keV to about 90 keV being suitable.

Figure 6:
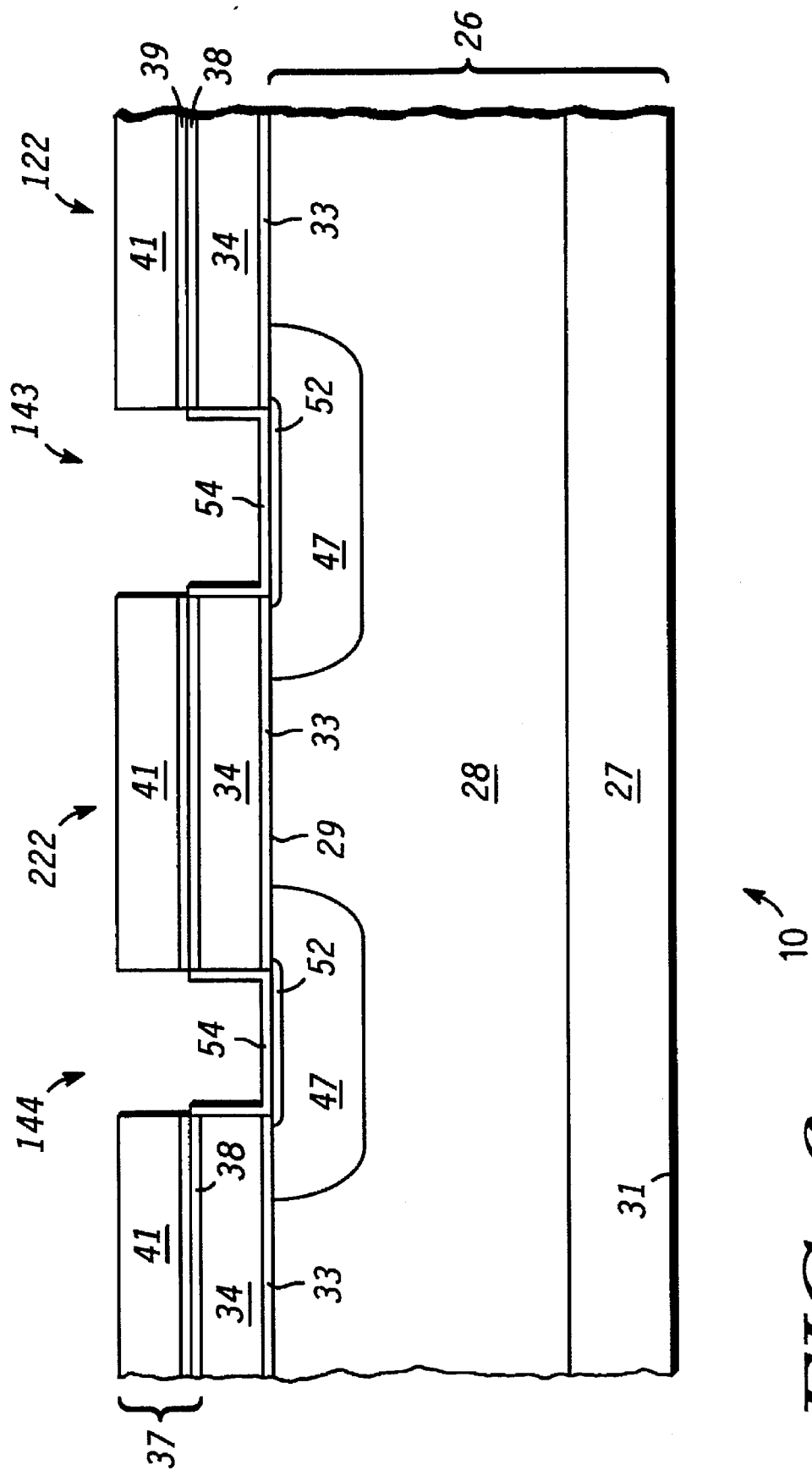

In a preferred embodiment, following the formation of implanted regions 52, an insulating layer 54 is formed in formed openings 143 and 144 to insulate exposed portions of polycrystalline gate layer 34 as shown in FIG. 6. Preferably, insulating layer 54 comprises a thermal oxide (i.e., a sidewall oxide layer) and is about 150 angstroms to about 450 angstroms thick.

Figure 7:
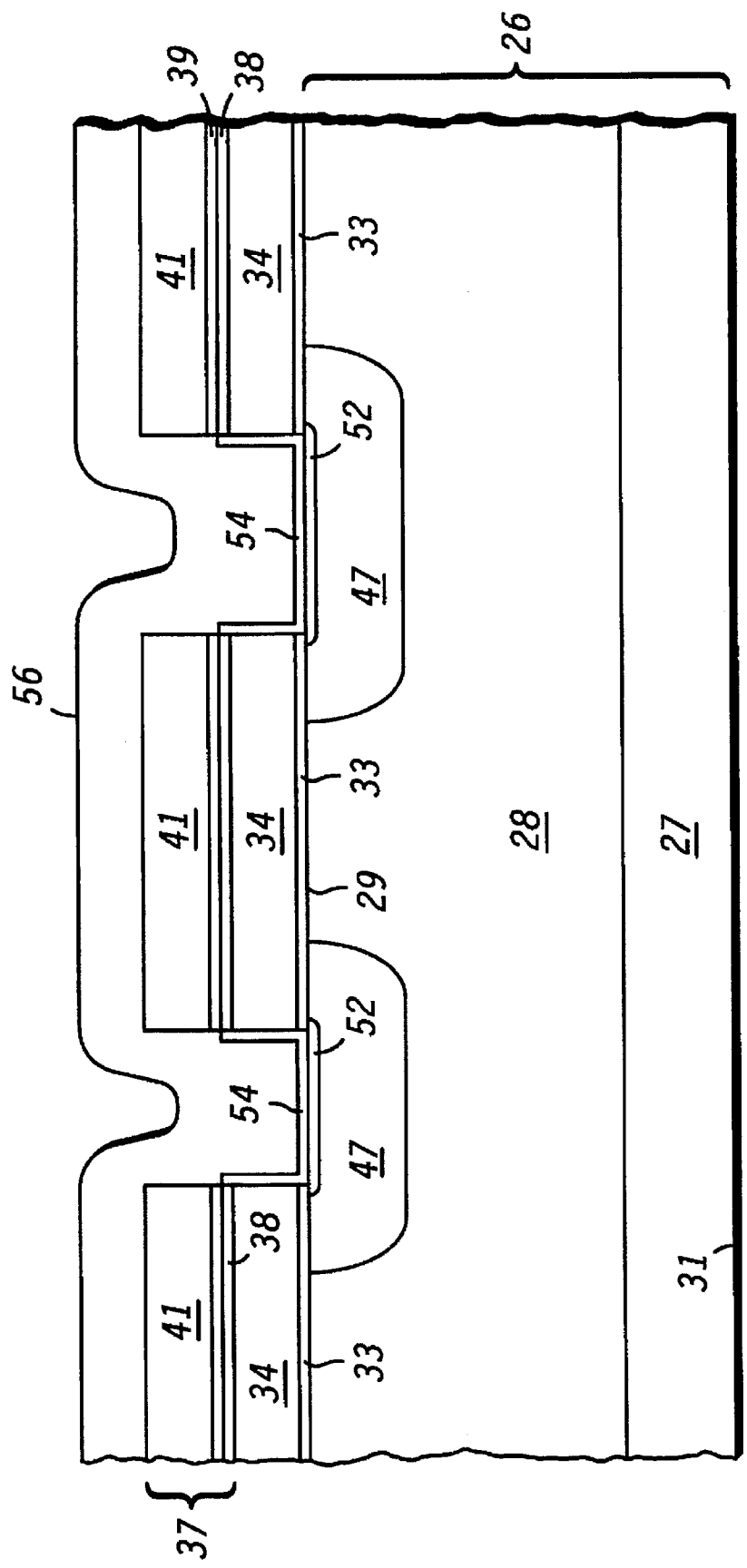

FIG. 7 illustrates substrate 26 after a conformal or spacer layer 56 has been formed over major surface 29. In the embodiment shown, spacer layer 56 is formed over dielectric layer 37 and insulating layer 54. Spacer layer 56 preferably comprises a silicon oxide, a silicon nitride, combinations thereof, or the like. Preferably, spacer layer 56 comprises a deposited silicon oxide having a thickness of about 5,000 angstroms to about 7,000 angstroms. In a alternative embodiment, spacer layer 56 comprises silicon nitride, which provides for a thinner spacer layer 56 compared to silicon oxide thereby allowing more active area in a finished device.

Figure 8:
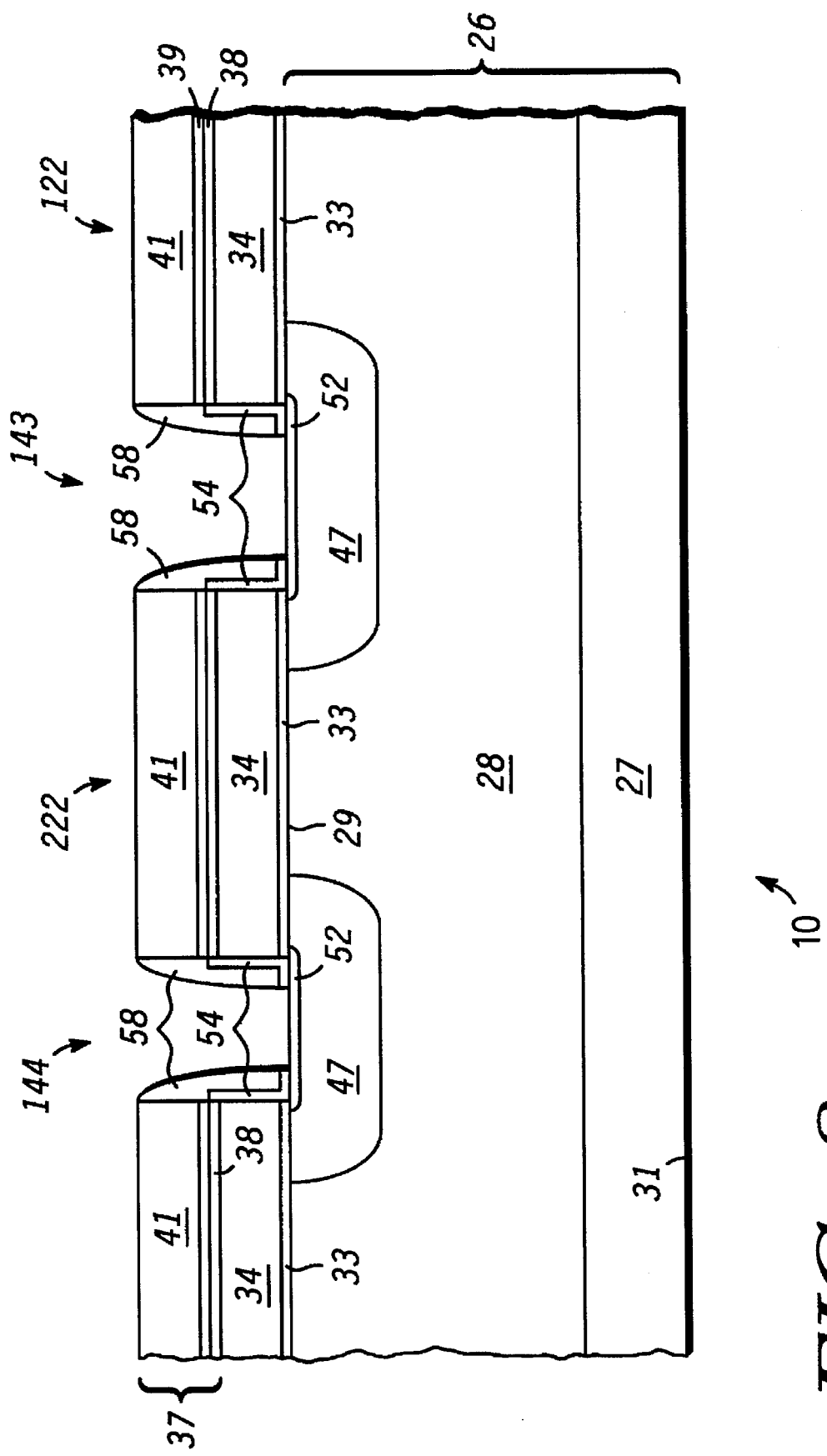

Following the formation of spacer layer 56, spacer layer 56 is anisotropically etched to form spacers 58 in formed openings 143 and 144 as shown in FIG. 8. Preferably, spacer layer 56 is etched in a reactive ion etching (RIE) system with an etch chemistry selected based on the material composition of spacer layer 56. For example, when spacer layer 56 comprises a silicon oxide or silicon nitride, spacer layer 56 is etched in fluorine based chemistry (e.g., $CF_4$, $SF_6$, or the like). In the preferred embodiment shown in FIG. 8, spacers 58 include portions of insulating layer 54. In an alternative embodiment, insulating layer 54 is not formed and spacers 58 insulate or passivate exposed portions of polycrystalline gate layer 34.

Figure 9:
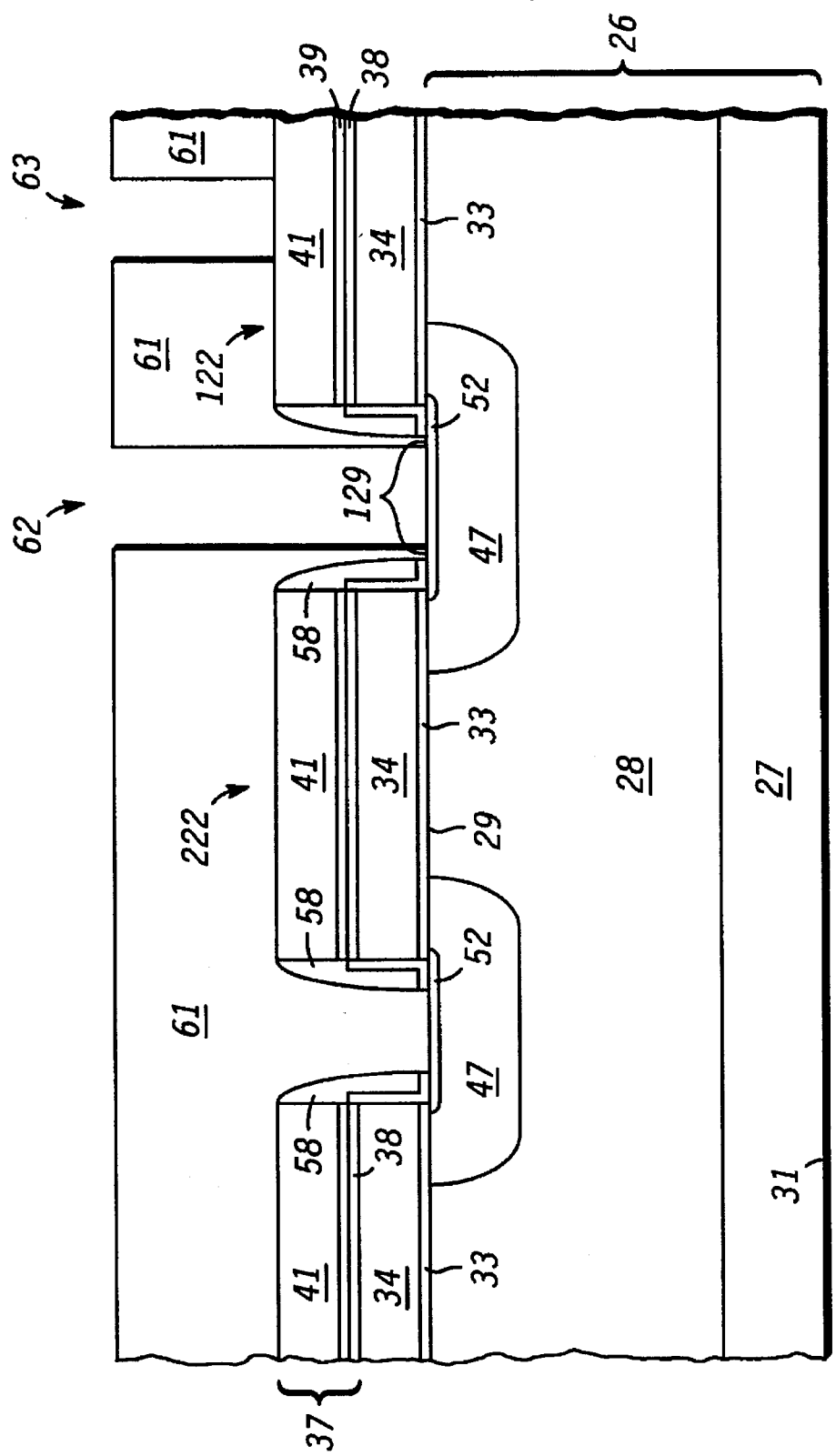

FIG. 9 illustrates substrate 26 after a protective layer 61 has been formed over major surface 29. Protective layer 61 comprises, for example, a photo-resist or other etch resistant materials. As shown in FIG. 9, protective layer 61 has been selectively patterned to form openings 62 and 63. Opening 62 is within formed opening 143 and opening 63 is above insulated gate region 122. According to the present invention, patterned protective layer 61 is formed using a second or contact photo-masking step. In other words, the formation of openings 62 and 63 represents a second step in the manufacture of structure 10 where a photo-masking step is used.

When protective layer 61 comprises a photo-resist, conventional photo-lithography techniques are used to form openings 62 and 63. Also, according to the present invention, opening 62 preferably has a width such that a portion 129 of major surface 29 remains between spacers 58 and opening 62. This provides for improved contact to substrate 26 after subsequent processing described below. Further, according to the present invention, by forming both openings 62 and 63 in a single photo-masking step and by using selective etching as described below, a separate gate contact photo-masking step to form opening 63 is eliminated.

Figure 10:
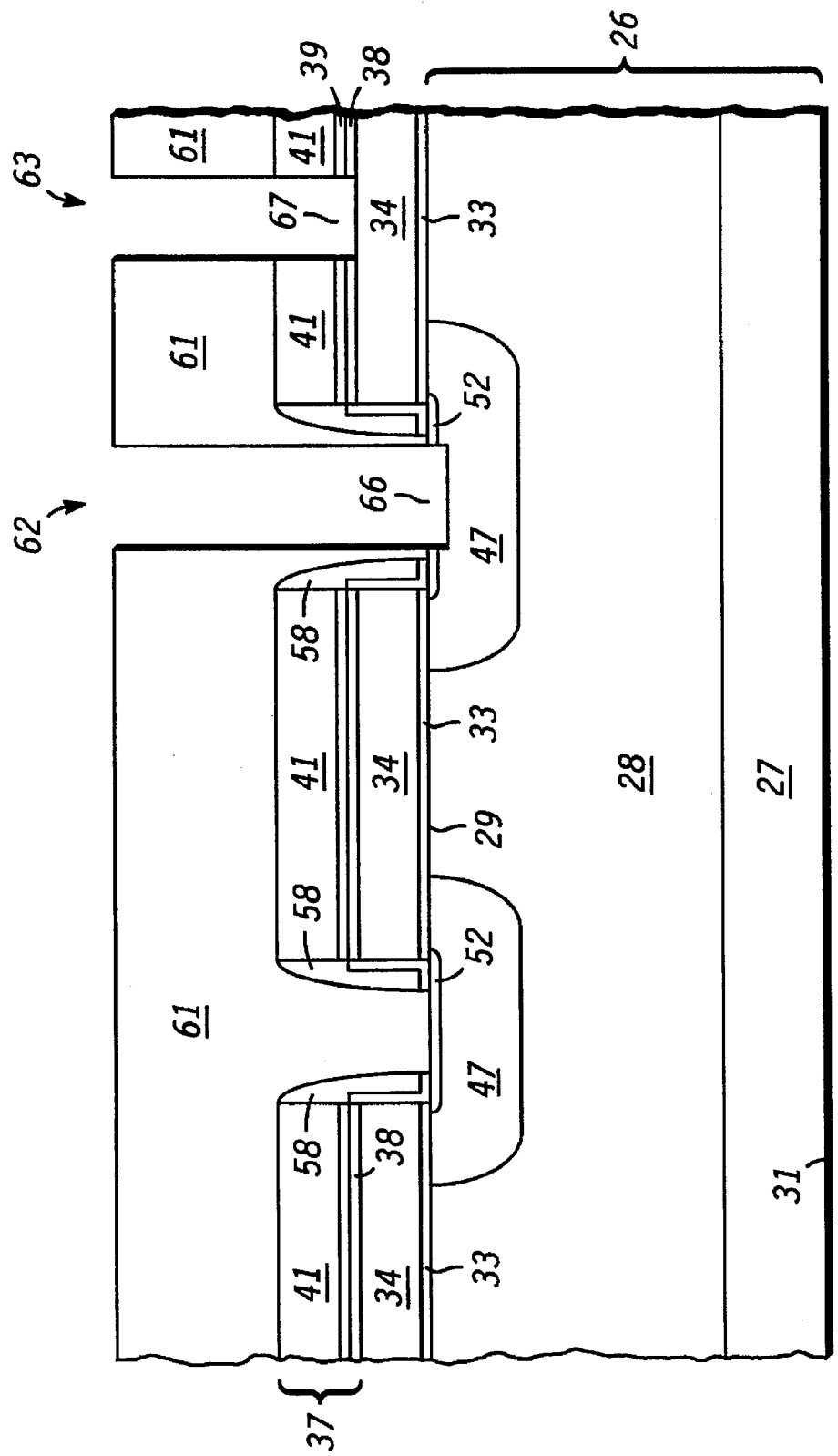

Following the formation of openings 62 and 63, an exposed portion of major surface 29 is selectively removed or etched to form etched portion 66 as shown in FIG. 10. Preferably, about 0.3 microns to about 0.5 microns of major surface 29 are etched in an RIE system using an etch chemistry that selectively etches substrate 26 while leaving dielectric layer 37 substantially unetched. For example, when substrate 26 comprises silicon and dielectric layer 37 comprises a silicon oxide, etched portion 66 is formed using a chlorine based etch chemistry (e.g., $Cl_2$) or the like.

Next, the exposed portion of dielectric layer 37 is selectively etched to form gate contact portion 67 while leaving etched portion 66 substantially unetched. For example, when substrate 26 comprises silicon and dielectric layer 37 comprises a silicon oxide, dielectric layer 37 is selectively etched in an RIE system using a $CF_4$ or $SF_6$ etch chemistry. Alternatively, dielectric layer 37 is etched in a wet etch using, for example, diluted hydrofluoric (HF) acid. In an optional embodiment, gate contact portion 67 is first etched followed by the formation of etched portion 66. In other words, the above selective etch steps can occur in either order. Referring back to FIG. 1, etched portion 66 corresponds to where a base contact region 21 is formed allowing contact to doped region 47.

Figure 11:
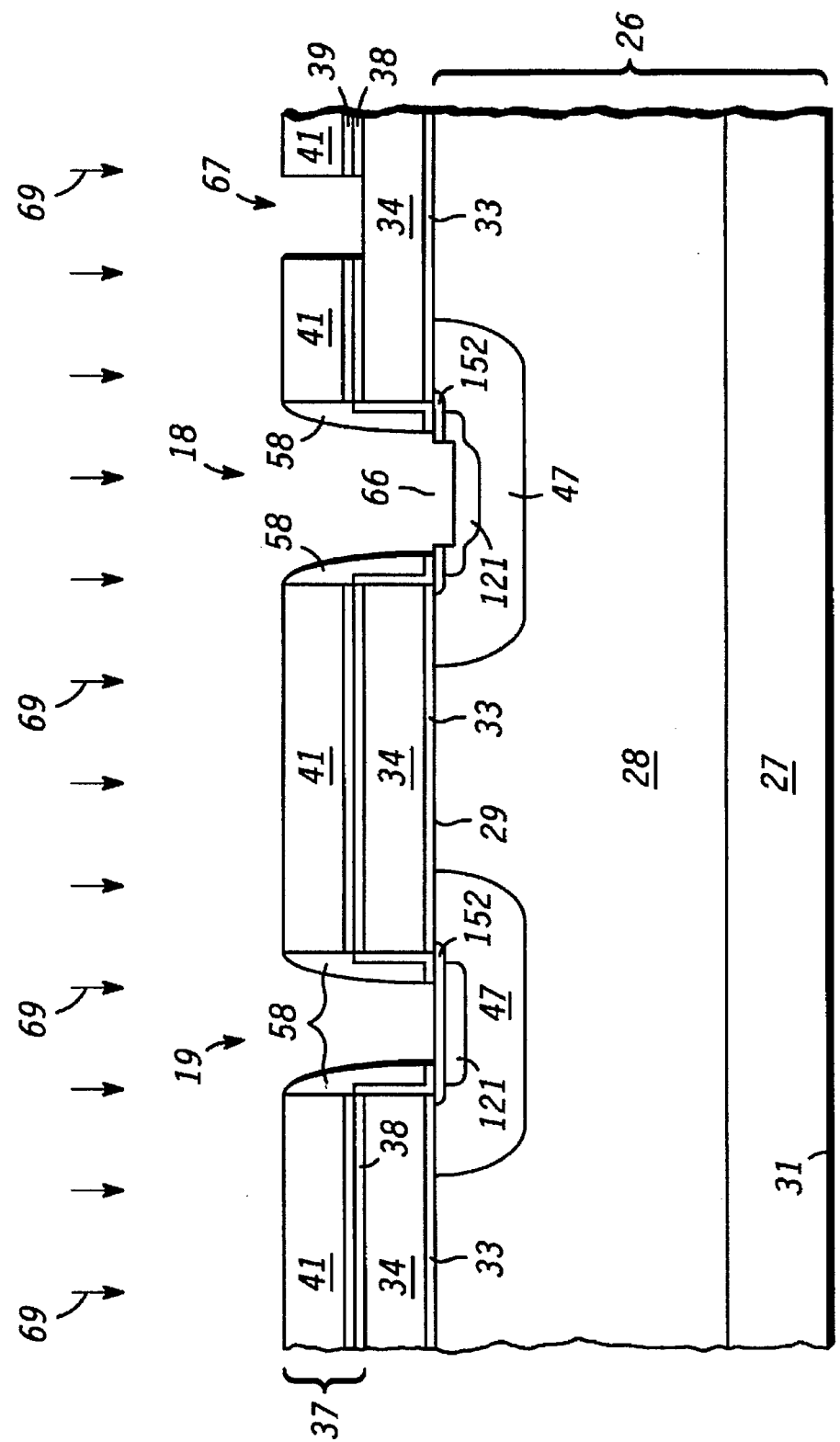

Next, protective layer 61 is removed using conventional techniques and dopant is incorporated into substrate 26 as shown in FIG. 11. In an n-channel device, substrate 26 is doped with a p-type dopant (e.g., boron) using ion implantation (as represented by arrows 69). An boron implant dose of about $1.0 \times 10^{14}$ atoms/cm$^2$ to about $4.0 \times 10^{15}$ atoms/cm$^2$ and an implant energy of about 30 keV to about 60 keV is suitable. Following this dopant step, the implanted dopant and implanted region 52 are annealed to form doped or base contact regions 121 and source or doped regions 152 respectively. A furnace anneal of about 900° C. for about 30 minutes or a comparable rapid thermal anneal is suitable. Doped regions 121 are self-aligned to spacers 58 and provide contact to doped regions 47 through etched portion 66.

In a preferred embodiment, doped regions 47 extend to a depth of about 1.0 micron from major surface 29, doped regions 152 extend to a depth of about 0.25 micron from major surface 29, and doped regions 121 extend to a depth of about 0.40 microns from major surface 29 in stripe portion 19 and to a greater amount in dumb-bell portion 18 because of etched portion 66. It is important that doped regions 121 do not extend through doped regions 47.

Figure 12:
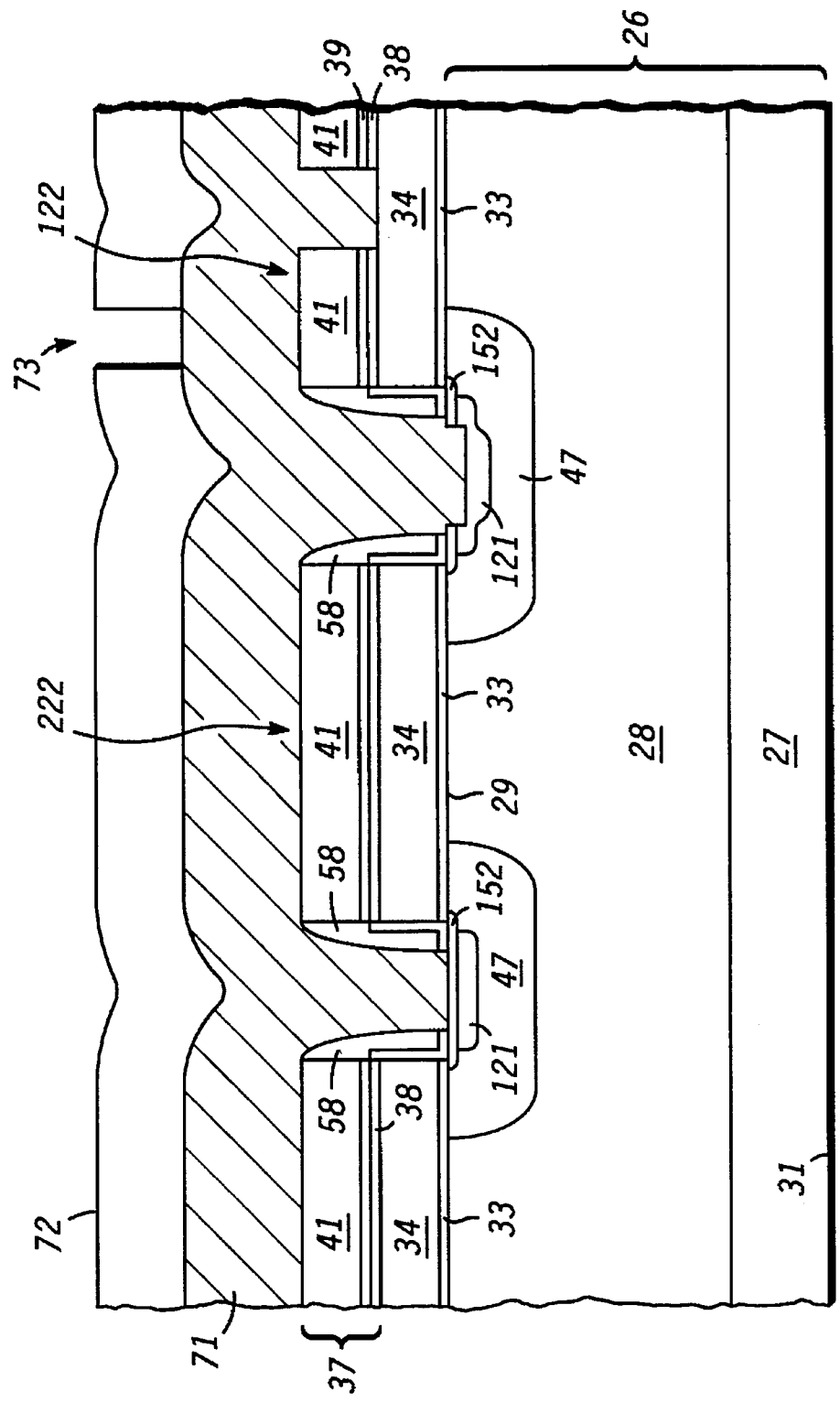

Turning now to FIG. 12, an ohmic or conductive layer 71 is formed over major surface 29 using conventional deposition techniques. In a preferred embodiment, ohmic layer 71 comprises an aluminum-silicon alloy and is about 2.0 microns to about 4.0 microns thick. Following the formation of ohmic layer 71, a protective layer 72 is formed over ohmic layer 71. Protective layer 72 is selectively patterned to form opening 73. Preferably, protective layer 72 comprises a photo-resist and, according to the present invention, the formation of opening 73 represents a third or metal photo-masking step.

Next, a portion of ohmic layer 71 is removed or etched through opening 73 using conventional etching techniques to provide a source contact 74 and a gate contact 76 as shown in FIG. 13. To complete structure 10, an ohmic layer 77 is formed on major surface 31 using conventional deposition techniques. Substrate 26 together with ohmic layer 77 provide a common drain for structure 10. Preferably, a final passivation layer is not used over source contact 74 and gate contact 76 thereby eliminating the need for a fourth or final passivation photo-masking step.

According to the present invention, substrate 26 is provided absent or without a field passivation or oxide layer (e.g., a thick oxide typically greater than 5,000 angstroms) in order to eliminate a photo-masking step. With the elimination of the field oxide, a new approach to terminating structure 10 is required. Typically, in the prior art, manufacturers utilize the thick field oxide together with diffused field limiting rings and channel stop regions to reduce device leakage, reduce undesirable parasitic effects, and to enhance device breakdown. Such termination structures require additional photo-masking steps.

FIG. 14 illustrates an enlarged cross-section view of a preferred embodiment of vertical power MOSFET device 10 according to the present invention having a termination portion 81 and an active portion 82. FIG. 14 corresponds to a cross-section of stripes 11-13 and portion of stripe 16, shown in FIG. 1. Note, FIG. 1 does not include ohmic layers 86-89, which are shown in FIG. 14. In a preferred embodiment, stripes 11-13 form rings that surround active stripes 16 and 17.

Active portion 82 includes an active base region 147 (equivalent to doped region 47), which extends from major surface 29 into substrate 26 and an active source region 252 within active base region 147. Active portion further includes a doped region 221, which is equivalent to doped region 121. During device operation, active portion 82 is tied to a source supply voltage $V_S$, as represented by terminal 101.

Termination portion 81 includes a termination region 11 extending from major surface 29 into substrate 26 between edge 23 and active portion 82 and a termination gate region 91 disposed over major surface 29 between termination region 11 and active portion 82. Termination region 11 includes a termination base region 247 (equivalent to doped region 47) and a termination source region 352 (equivalent to doped regions 152). Termination region 11 further includes a doped region 321, which is equivalent to doped region 121. Termination gate region 91 is equivalent to insulated gate region 122.

According to the present invention, termination region 11 is electrically coupled to termination gate region 91 and to the a common drain. That is, termination region 11 is tied to the drain supply voltage $V_D$. This represented by terminals 93 and 94. As shown in FIG. 14, termination region 11 preferably is tied to termination gate region 91 using ohmic layer 86 through gate contact portion 111. Ohmic layer 86 is conveniently formed at the same time that source contact 74 and gate contact 76 are formed. Termination region 11 preferably is tied to the common drain (i.e., $V_D$) in package form using, for example, a wire bond or the like. Alternatively, termination region 11 is tied to the common drain through substrate 26 and a metal overlay adjacent edge 23.

Preferably, and as shown in FIG. 14, termination portion 81 includes additional termination regions 12 and 13 together with additional termination gate regions 96 and 97. Termination gate regions 96 and 97 are equivalent to insulated gate region 122. Termination regions 12 and 13 are between termination region 11 and active portion 82. Like termination region 11, termination regions 12 and 13 include a termination base region 247 and a termination source region 352, which are equivalent to doped regions 47 and 152 respectively. Also, termination regions 12 and 13 further include a doped region 321, which is equivalent to doped region 121.

Additionally, termination regions 12 and 13 are electrically coupled to termination gate regions 96 and 97 respectively. This preferably is done using ohmic layers 87 and 88 through gate contact portions 112 and 113 respectively. Ohmic layers 87 and 88 are conveniently formed at the same time that source contact 74 and gate contact 76 are formed.

By electrically coupling each termination region to an adjacent termination gate region and by coupling termination region 11 to $V_D$, parasitic transistors formed by termination source region 352, termination base region 247 and substrate 26 and by termination base region 247, semiconductor substrate 26, and an adjacent termination base region 247 are in an off state. Additionally, by using multiple termination regions, the voltage $V_D$ is divided across the multiple termination regions so that no one termination gate region sustains the entire voltage $V_D$. This reduces the likelihood of exceeding the dielectric strength of gate dielectric layer 33 and allows for the elimination of the field oxide and its accompanying photo-masking step. The individual regions and layers that form termination portion 81 preferably are equivalent to the individual regions and layers that form active portion 82, which eliminates the need for separate photo-masking steps to form termination portion 81.

Preferably, the number of termination regions included in termination portion 81 is determined based on the following equation:

$$n = \frac{V_D}{0.3(D)(t_{ox})} \quad \text{(eq. 1)}$$

where:

n=the number of termination regions required;

$V_D$=is the rated drain supply voltage of the device; and

D=the dielectric strength of gate dielectric layer 33 (in volts/centimeter); and $t_{ox}$=the thickness of gate dielectric layer 33 (in centimeters).

Preferably, the calculated value of n using equation 1 is rounded to the nearest whole number. The constant 0.3 corresponds to a typical 30% safety margin. This constant is adjusted up or down depending on the quality of gate dielectric layer 33. From the above formula, it is apparent that the number n of termination regions required increases as $t_{ox}$ decreases for a constant $V_D$ and increases as $V_D$ increases for a constant $t_{ox}$.

For example, for a 20 volt device with a 250 angstrom gate oxide thickness where $D=1.0\times10^7$ V/cm, using equation 1, n is calculated to be 2.6, which preferably is rounded to 3. With a 30% safety margin, each termination gate region sustains about 7.5 volts. For a 30 volt device with a 400 angstrom gate oxide thickness, n is calculated to be 2.5, which preferably is rounded to 3. With a 30% safety margin, each termination gate region sustains about 12 volts. For a 60 volt device with an 800 angstrom gate oxide, n is calculated to be 2.5, which preferably is rounded to 3. With a 30% safety margin, each termination gate region sustains about 24 volts.

By now it should be apparent that there has been provided a method for forming a vertical power MOSFET device. By eliminating a field oxide, a final passivation, and by forming a base contact and a gate contact using a single photo-masking step, the device is formed using only three photo-masking steps. This saves significantly on manufacturing costs. Additionally, an edge termination structure has been provided that supports the elimination of the field oxide and utilizes the same steps that are used to form the active devices, thereby providing a reliable and cost effective device.

We claim:

1. A method of forming a semiconductor device comprising the steps of:

providing a semiconductor substrate having a first major surface, the semiconductor substrate having a first conductivity type;

forming a first insulated gate region and a second insulated gate region on a semiconductor substrate using a first photo-masking step;

forming a first doped region of a second conductivity type in the semiconductor substrate through a first opening between the first and second insulated gate regions, the first doped region self-aligned to the first and second insulated gate regions;

forming a second doped region of the first conductivity type within the first doped region through the first opening, the second doped region self-aligned to the first and second insulated gate regions;

forming a protective layer over the semiconductor substrate;

selectively patterning the protective layer using a second photo-masking step to form a second opening within the first opening and a third opening above the second insulated gate region;

removing a portion of the semiconductor substrate through the second opening and a portion of the second insulated gate region through the third opening to expose a conductive portion;

forming an ohmic layer over the semiconductor substrate; and selectively patterning the ohmic layer using a third photo-masking step to form a first ohmic contact to the semiconductor substrate and a second ohmic contact to the conductive portion.

2. The method of claim 1 further comprising the step of forming a third doped region in the first doped region after the removing step, the third doped region having the second conductivity type.

3. The method of claim 1 wherein the removing step comprises the steps of:

etching the portion of the semiconductor substrate; and etching the portion of the second insulated gate region after etching the portion of the semiconductor substrate.

4. The method of claim 1 wherein step of providing the semiconductor substrate includes providing the semiconductor substrate absent a field oxide layer.

5. The method of claim 1 wherein the step of forming the first and second insulated gate regions comprises the steps of:
  forming a gate dielectric layer over the first major surface;
  forming a conductive layer over the gate dielectric layer;
  forming an interlayer dielectric over the conductive layer;
  forming a first photo-resist layer over the interlayer dielectric;
  patterning the first photo-resist layer using the first photo-masking step; and
  removing portions of the interlayer dielectric and portions of the conductive layer to form the first and second insulated gate regions.

6. The method of claim 5 further comprising the step of insulating exposed portions of the conductive layer after the removing step.

7. The method of claim 5 wherein the step of forming the interlayer dielectric comprises the steps of:
  forming a first silicon oxide layer over the conductive layer;
  forming a silicon nitride layer over the first silicon oxide layer; and
  forming a second silicon oxide layer over the silicon nitride layer.

8. The method of claim 7 wherein the step of removing the portion of semiconductor substrate includes etching the semiconductor substrate in an etchant that is selectively etches the portion of the semiconductor substrate while leaving the second silicon oxide layer substantially unetched, and wherein the step of removing the portion of the second insulated gate region includes selectively etching a portion of the second silicon oxide layer, a portion of the silicon nitride layer, and a portion of the first silicon oxide layer while leaving the semiconductor substrate substantially unetched.

9. A process for forming a vertical power MOSFET device comprising the steps of:
  providing a semiconductor substrate having a first and second major surface, wherein the semiconductor substrate is of a first conductivity type;
  forming a gate dielectric layer over the first major surface;
  forming a polycrystalline gate layer over the gate dielectric layer;
  forming a dielectric layer over the polycrystalline gate layer;
  patterning the dielectric layer, the polycrystalline gate layer, and the gate dielectric layer to form a first insulated gate region, a second insulated gate region and to form a first opening between the first and second insulated gate regions;
  forming a first base region in the semiconductor substrate self-aligned to the first and second insulated gate regions, wherein the first base region has a second conductivity type opposite the first conductivity type;
  forming a first source region in the first base region self-aligned to the first and second insulated gate regions, wherein the first source region has the first conductivity type;
  forming spacers in the first opening;
  forming a protective layer over the first major surface;
  patterning the protective layer to form a second opening within the first opening and a third opening above the second insulated gate region;
  removing a portion of the first major surface through the second opening;
  removing a portion of the dielectric layer through the third opening to expose a portion of the polycrystalline gate layer;
  forming a doped region of the second conductivity type in the first major surface self-aligned to the spacers;
  forming an ohmic layer over the first major surface; and
  patterning the ohmic layer to provide a source contact and a gate contact.

10. The process of claim 9 wherein the step of forming the dielectric layer includes:
  forming first oxide layer over the polycrystalline gate layer;
  forming a nitride layer over the first oxide layer; and
  forming a second oxide layer over the nitride layer.

11. The process of claim 9 wherein the step of patterning the protective layer includes patterning the protective layer such that when the portion of the first major surface is removed, a portion of the first major surface between the spacers and the removed portion of the first major surface remains.

12. The process of claim 9 wherein the step of providing the semiconductor substrate includes providing the semiconductor substrate without a field oxide present on the first and second major surfaces.

13. The process of claim 9 further comprising the step of forming a sidewall oxide layer on exposed portions of the polycrystalline gate layer after the step of patterning the dielectric layer, the polycrystalline gate layer, and the gate dielectric layer.

14. The process of claim 9 wherein the step of forming the spacers includes forming the spacers comprising one of a silicon oxide and a silicon nitride.

15. The process of claim 9 wherein the step of removing the portion of the first major surface includes etching the portion of the first major surface using an etchant that selectively etches the semiconductor substrate while leaving the dielectric layer substantially unetched, and wherein the step of removing the portion of the dielectric layer includes etching the portion of the dielectric layer using an etchant that selectively etches the dielectric layer while leaving the semiconductor substrate substantially unetched.

16. A vertical power MOSFET device comprising:
  a semiconductor substrate having a first conductivity type, a first major surface, a second major surface opposite the first major surface, and a first edge, wherein the second major surface forms a common drain;
  an active portion including an active base region of a second conductivity type extending from the first major surface into the semiconductor substrate and an active source region within the active base region, the active source region having the first conductivity type; and
  a termination portion including a first termination region extending from the first major surface into the semiconductor substrate between the first edge and the active portion and a first termination gate region disposed over the first major surface between the first termination region and the active portion, wherein the first termination region comprises a first termination base region of the first conductivity type and a first termination source region of the second conductivity type, and wherein the first termination region is electrically coupled to the first termination gate region and the common drain.

17. The device of claim 16 wherein the termination portion further comprises a second termination region between the first termination region and the active portion and a second termination gate region disposed on the first major surface between the second termination region and the active portion, wherein the first termination gate region is between the first and second termination regions, and wherein the second termination region includes a second termination base region of the second conductivity type extending from the first major surface into the semiconductor substrate and a second termination source region of the first conductivity type within the second termination base region, and wherein the second termination region is electrically coupled to the second termination gate region.

18. The device of claim 17 wherein the termination portion further comprises a third termination region between the second termination region and the active portion and a third termination gate region disposed on the first major surface between the third termination region and the active portion, wherein the second termination gate region is between the second and third termination regions, and wherein the third termination region includes a third termination base region of the second conductivity type extending from the first major surface into the semiconductor substrate and a third termination source region of the first conductivity type within the third termination base region, and wherein the third termination region is electrically coupled to the third termination gate region.

19. The device of claim 16 wherein the termination portion comprises a total of n termination regions including the first termination region, each additional termination region having a termination base region of the second conductivity type and a termination source region of the first conductivity type, and wherein each additional termination region has an adjacent termination gate region disposed over the first major surface, and wherein each termination gate region comprises a gate dielectric layer having a thickness, and wherein the first termination region is an outermost termination region, and wherein each additional termination region is electrically coupled to the adjacent termination gate region, and wherein n is defined as:

$$n = \frac{V_D}{0.3(D)(t)}$$

where $V_D$ is a rated drain supply voltage of the vertical MOSFET device, D is a dielectric strength of the gate dielectric layer in volts/centimeter, and t is the thickness of the gate dielectric layer in centimeters.

20. A method for forming a vertical power MOSFET device comprising the steps of:

providing a semiconductor substrate having a first conductivity type, a first major surface, a second major surface opposite the first major surface, and a first edge, wherein the second major surface forms a common drain;

forming an active portion including an active base region of a second conductivity type extending from the first major surface into the semiconductor substrate and an active source region within the active base region, the active source region having the first conductivity type; and forming a termination portion including a first termination region extending from the first major surface into the semiconductor substrate between the first edge and the active portion and a first termination gate region disposed over the first major surface between the first termination region and the active portion, wherein the first termination region comprises a first termination base region of the first conductivity type and a first termination source region of the second conductivity type, and wherein the first termination region is electrically coupled to the first termination gate region and the common drain.

* * * * *